US009726781B2

(12) United States Patent
San Martin et al.

(10) Patent No.: US 9,726,781 B2
(45) Date of Patent: Aug. 8, 2017

(54) RESISTIVITY MEASUREMENT USING A GALVANIC TOOL

(71) Applicant: Halliburton Energy Services, Inc., Houston, TX (US)

(72) Inventors: Luis Emilio San Martin, Houston, TX (US); Burkay Donderici, Houston, TX (US); Ahmed E. Fouda, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/112,760

(22) PCT Filed: Oct. 1, 2015

(86) PCT No.: PCT/US2015/053542
§ 371 (c)(1),
(2) Date: Jul. 20, 2016

(87) PCT Pub. No.: WO2016/057311
PCT Pub. Date: Apr. 14, 2016

(65) Prior Publication Data
US 2016/0349405 A1    Dec. 1, 2016

Related U.S. Application Data

(60) Provisional application No. 62/062,623, filed on Oct. 10, 2014.

(51) Int. Cl.
*G01V 3/38* (2006.01)
*G01V 13/00* (2006.01)
(Continued)

(52) U.S. Cl.
CPC ........... *G01V 13/00* (2013.01); *G01R 35/005* (2013.01); *G01V 3/18* (2013.01); *G01V 3/24* (2013.01)

(58) Field of Classification Search
CPC ... G01V 3/38; G01V 3/28; G01V 3/24; G01V 3/20; G01V 3/26; G01V 3/18; G01V 3/30;
(Continued)

(56) References Cited

U.S. PATENT DOCUMENTS 6,353,322 B1    3/2002    Tabarovsky et al.
6,373,254 B1    4/2002    Dion et al.
(Continued)

FOREIGN PATENT DOCUMENTS

WO    2014/011170 A1    1/2014

OTHER PUBLICATIONS

Shattuck, D., M. Bittar, and Liang C. Shen. "Scale modeling of the laterolog using synthetic focusing methods." The Log Analyst 28.4 (1987): 357-369.
(Continued)

*Primary Examiner* — Jermele M Hollington
*Assistant Examiner* — Taqi Nasir
(74) *Attorney, Agent, or Firm* — Benjamin Fite; Baker Botts L.L.P.

(57) ABSTRACT

An example calibration method for a galvanic tool may include determining an internal coupling impedance between at least two electrodes of the galvanic tool, and inputting the determined internal coupling impedances into an equation used to evaluate the response of the tool. Voltage and current measurements may be generated from the galvanic tool using a calibration device. A leakage current value through at least one of the two electrodes may be determined based, at least in part, on the voltage and current measurements and the equation. The leakage current may be stored.

19 Claims, 4 Drawing Sheets

(51) Int. Cl.
*G01V 3/24* (2006.01)
*G01R 35/00* (2006.01)
*G01V 3/18* (2006.01)

(58) Field of Classification Search
CPC . G01V 3/00; G01V 3/02; G01V 13/00; G01V 3/08; G01V 3/083; G01V 3/088
USPC ....... 324/373–375, 370, 371, 366, 367, 354, 324/355, 356, 357, 358, 363, 364, 130; 702/6, 7, 11
See application file for complete search history.

(56) References Cited

U.S. PATENT DOCUMENTS

| | | | | |
|---|---|---|---|---|
| 2002/0062992 | A1* | 5/2002 | Fredericks | E21B 47/00 175/40 |
| 2007/0035306 | A1 | 2/2007 | Forgang et al. | |
| 2008/0252296 | A1* | 10/2008 | Hu | G01V 3/24 324/366 |
| 2010/0013487 | A1* | 1/2010 | Bloemenkamp | G01V 3/24 324/367 |
| 2010/0026305 | A1* | 2/2010 | Yanzig | G01V 3/20 324/355 |
| 2010/0039115 | A1* | 2/2010 | Bespalov | G01V 3/20 324/355 |
| 2011/0025335 | A1* | 2/2011 | Itskovich | G01V 3/24 324/355 |
| 2011/0156710 | A1 | 6/2011 | Wang | |
| 2011/0227580 | A1* | 9/2011 | Gold | G01V 3/24 324/366 |
| 2013/0234718 | A1 | 9/2013 | Li et al. | |

OTHER PUBLICATIONS

Smits, J. W., et al. "Improved resistivity interpretation utilizing a new array laterolog tool and associated inversion processing." SPE Paper 49328, SPE Annual Technical Conference and Exhibition. Society of Petroleum Engineers, 1998.

Cozzolino, Klaus, and Jadir da Conceição da Silva. "Synthetic focusing and simulation of dual laterolog tool in axisymmetric subsurface models." Journal of Applied Geophysics 61.2 (2007): 102-110.

International Search Report and Written Opinion issued in related PCT Application No. PCT/US2015/053542 mailed Dec. 16, 2015, 9 pages.

International Preliminary Report on Patentability issued in related Application No. PCT/US2015/053542, mailed Apr. 20, 2017 (7 pages).

* cited by examiner

RESISTIVITY MEASUREMENT USING A GALVANIC TOOL

CROSS-REFERENCE TO RELATED APPLICATION

This application is a U.S. National Stage Application of International Application No. PCT/US2015/053542 filed Oct. 1, 2015, and claims the benefit of U.S. Provisional Application No. 62/062,623, entitled "IMPROVED RESISTIVITY MEASUREMENT USING A GALVANIC TOOL" and filed Oct. 10, 2014, both of which are incorporated herein by reference for all purposes.

BACKGROUND

The present disclosure relates generally to well logging operations and, more particularly, to an improved resistivity measurement using a galvanic tool.

Hydrocarbons, such as oil and gas, are commonly obtained from subterranean formations that may be located onshore or offshore. The development of subterranean operations and the processes involved in removing hydrocarbons from a subterranean formation are complex. Typically, subterranean operations involve a number of different steps such as, for example, drilling a wellbore at a desired well site, treating the wellbore to optimize production of hydrocarbons, and performing the necessary steps to produce and process the hydrocarbons from the subterranean formation.

Existing well drilling operations require information on formation characteristics to aid in drilling decisions. Numerous measurement techniques are used, including logging while drilling (LWD), measuring while drilling (MWD), and wireline. One such measurement technique includes the use of a galvanic tool to take resistivity measurements of the surrounding formation. Galvanic tools may include one or more electrodes through which current is injected into and returned from the formation to generate the resistivity measurements. During typical operation current should ideally only flow between selected ones of the electrodes. In practice, however, "leakage current" may run through other ones of the electrodes. This may reduce the accuracy of the resulting resistivity measurements.

FIGURES

Some specific exemplary embodiments of the disclosure may be understood by referring, in part, to the following description and the accompanying drawings.

Figure 1:
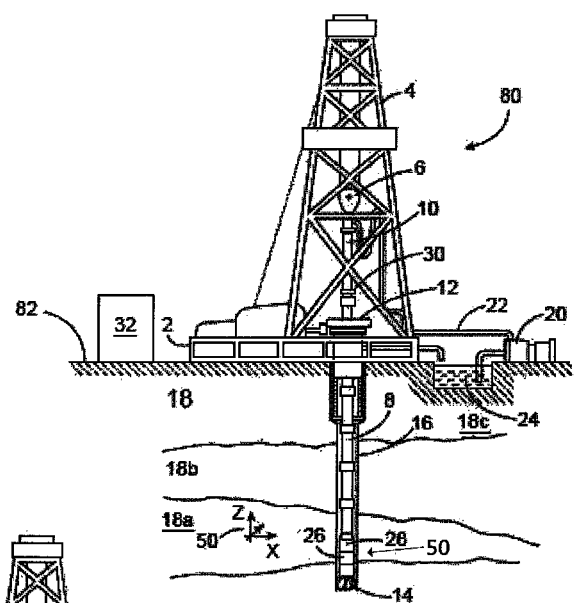
FIG. 1 is a diagram showing an illustrative logging while drilling environment, according to aspects of the present disclosure.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally to well drilling operations and, more particularly, to an improved resistivity measurement using a galvanic tool.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. It may also include one or more interface units capable of transmitting one or more signals to a controller, actuator, or like device.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

Illustrative embodiments of the present disclosure are described in detail herein. In the interest of clarity, not all features of an actual implementation may be described in this specification. It will of course be appreciated that in the development of any such actual embodiment, numerous implementation specific decisions are made to achieve the specific implementation goals, which will vary from one implementation to another. Moreover, it will be appreciated that such a development effort might be complex and time-consuming, but would nevertheless be a routine undertaking for those of ordinary skill in the art having the benefit of the present disclosure.

To facilitate a better understanding of the present disclosure, the following examples of certain embodiments are given. In no way should the following examples be read to limit, or define, the scope of the disclosure. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Embodiments may be implemented using a tool that is made suitable for testing, retrieval and sampling along sections of the formation. Embodiments may be implemented with tools that, for example, may be conveyed through a flow passage in tubular string or using a wireline, slickline, coiled tubing, downhole robot or the like.

The terms "couple" or "couples" as used herein are intended to mean either an indirect or a direct connection. Thus, if a first device couples to a second device, that connection may be through a direct connection or through an indirect mechanical or electrical connection via other devices and connections. Similarly, the term "communicatively coupled" as used herein is intended to mean either a direct or an indirect communication connection. Such connection may be a wired or wireless connection such as, for example, Ethernet or LAN. Such wired and wireless connections are well known to those of ordinary skill in the art and will therefore not be discussed in detail herein. Thus, if a first device communicatively couples to a second device, that connection may be through a direct connection, or through an indirect communication connection via other devices and connections.

Modern petroleum drilling and production operations demand information relating to parameters and conditions downhole. Several methods exist for downhole information collection, including LWD and MWD, and wireline. In LWD, data is typically collected during the drilling process, thereby avoiding any need to remove the drilling assembly to insert a wireline logging tool. LWD consequently allows the driller to make accurate real-time modifications or corrections to optimize performance while minimizing down time. MWD is the term for measuring conditions downhole concerning the movement and location of the drilling assembly while the drilling continues. LWD concentrates more on formation parameter measurement. While distinctions between MWD and LWD may exist, the terms MWD and LWD often are used interchangeably. For the purposes of this disclosure, the term LWD will be used with the understanding that this term encompasses both the collection of formation parameters and the collection of information relating to the movement and position of the drilling assembly.

The accuracy of resistivity measurements from galvanic tools may be improved by accounting for leakage currents between the electrodes of a galvanic tool. As will be described in detail below, galvanic tool leakage currents may be accounted for and the resulting resistivity measurements may be improved by determining an internal coupling impedance between each of the electrodes as part of a calibration process. The determined internal coupling impedance values may be incorporated into a model of the tool that may be used to calculate resistivity values for the formation, and may allow for measurement errors caused by the leakage currents to be corrected before the resistivity values are calculated. In certain embodiments, the leakage currents that run through the electrodes of the galvanic tool also may be determined while the tool is positioned downhole, and the internal coupling impedance values updated to account for downhole pressure and temperature conditions.

FIG. 1 is a diagram showing a subterranean drilling system 80 incorporating at least one galvanic tool 26, according to aspects of the present disclosure. The drilling system 80 comprises a drilling platform 2 positioned at the surface 82. In the embodiment shown, the surface 82 comprises the top of a formation 84 containing one or more rock strata or layers 18*a-c*, and the drilling platform 2 may be in contact with the surface 82. In other embodiments, such as in an off-shore drilling operation, the surface 82 may be separated from the drilling platform 2 by a volume of water.

The drilling system 80 comprises a derrick 4 supported by the drilling platform 2 and having a traveling block 6 for raising and lowering a drill string 8. A kelly 10 may support the drill string 8 as it is lowered through a rotary table 12. A drill bit 14 may be coupled to the drill string 8 and driven by a downhole motor and/or rotation of the drill string 8 by the rotary table 12. As bit 14 rotates, it creates a borehole 16 that passes through one or more rock strata or layers 18. A pump 20 may circulate drilling fluid through a feed pipe 22 to kelly 10, downhole through the interior of drill string 8, through orifices in drill bit 14, back to the surface via the annulus around drill string 8, and into a retention pit 24. The drilling fluid transports cuttings from the borehole 16 into the pit 24 and aids in maintaining integrity or the borehole 16.

The drilling system 80 may comprise a bottom hole assembly (BHA) coupled to the drill string 8 near the drill bit 14. The BHA may comprise various downhole measurement tools and sensors and LWD and MWD elements, including the galvanic tool 26. As used herein, a galvanic tool may comprise any tool with electrodes through which current is injected into a subterranean formation and a voltage response of the formation to the injected current is measured. Example galvanic tools include but are not limited to array laterologs, dual laterologs, and micro-resistivity logs. As the bit extends the borehole 16 through the formations 18, the tool 26 may collect resistivity measurements relating to borehole 16 and the formation 84. In certain embodiments, the orientation and position of the tool 26 may be tracked using, for example, an azimuthal orientation indicator, which may include magnetometers, inclinometers, and/or accelerometers, though other sensor types such as gyroscopes may be used in some embodiments.

The tools and sensors of the BHA including the tool 26 may be communicably coupled to a telemetry element 28. The telemetry element 28 may transfer measurements from tool 26 to a surface receiver 30 and/or to receive commands from the surface receiver 30. The telemetry element 28 may comprise a mud pulse telemetry system, and acoustic telemetry system, a wired communications system, a wireless communications system, or any other type of communications system that would be appreciated by one of ordinary skill in the art in view of this disclosure. In certain embodiments, some or all of the measurements taken at the tool 26 may also be stored within the tool 26 or the telemetry element 28 for later retrieval at the surface 82.

In certain embodiments, the drilling system 80 may comprise a surface control unit 32 positioned at the surface 102. The surface control unit 32 may comprise an information handling system communicably coupled to the surface receiver 30 and may receive measurements from the tool 26 and/or transmit commands to the tool 26 though the surface receiver 30. The surface control unit 32 may also receive measurements from the tool 26 when the tool 26 is retrieved at the surface 102. The surface control unit 32 may process the measurements received from the tool 26 to calculate one or more parameters of the formation, such as the resistivity of the formation. As will be described in detail below, processing the measurements received from the tool 26 to calculate one or more parameters of the formation may include calibrating the measurements to account for leakage currents within the tool 26, and determining resistivity values for the formation 8 based, at least in part, on the calibrated measurements. In certain embodiments, some or all of the measurements may be processed, stored, and/or visualized at a different information handling system, such as a downhole controller associated with the tool 26 or BHA and/or or a remote information handling system that may receive the galvanic measurements through a wireless transmission medium, such as a local area network or a satellite network.

Figure 2:
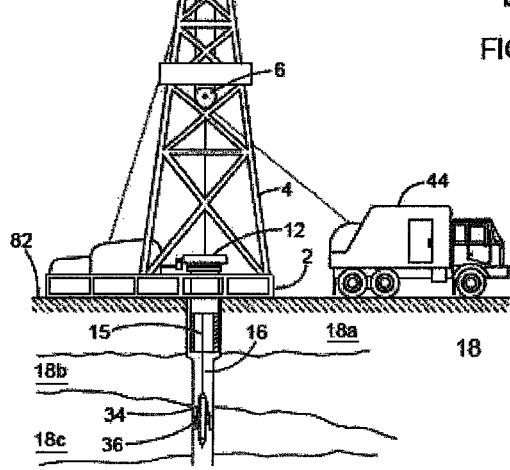
FIG. 2 is a diagram showing an illustrative wireline logging environment, according to aspects of the present disclosure.

At various times during the drilling process, the drill string 8 may be removed from the borehole 16 as shown in FIG. 2. Once the drill string 8 has been removed, measurement/logging operations can be conducted using a wireline tool 34, e.g., an instrument that is suspended into the borehole 16 by a cable 15 having conductors for transporting power to the tool and telemetry from the tool body to the surface 102. The wireline tool 34 may comprise a galvanic tool 36, similar to the tool 26 described above. The tool 36 may be communicatively coupled to the cable 15. A logging facility 44 (shown in FIG. 8 as a truck, although it may be any other structure) may collect measurements from the tool 36, and may include computing facilities (including, e.g., a control unit/information handling system) for controlling, processing, storing, and/or visualizing the measurements gathered by the tool 36. The computing facilities may be communicatively coupled to the tool 36 by way of the cable 15. In certain embodiments, the control unit 32 may serve as the computing facilities of the logging facility 44. Additionally, as described above, a remote information handling system may receive and process, store, and/or visualize galvanic measurements received from the tool 36.

Figure 3:
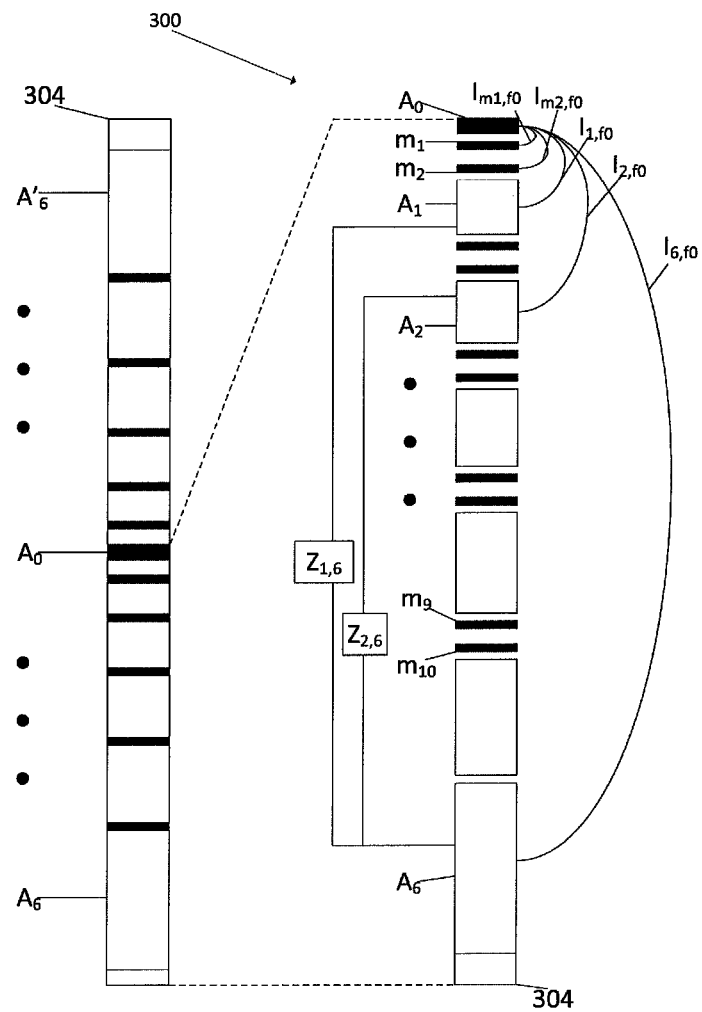
FIG. 3 is a diagram of an example galvanic tool, according to aspects of the present disclosure.

FIG. 3 illustrates an example galvanic tool 300, according to aspects of the present disclosure. The galvanic tool 300 may include similar functionality as and/or be incorporated in the LWD/MWD elements within the BHA described with reference to FIG. 1. Additionally, the galvanic tool 300 may include similar functionality as and/or be incorporated in the wireline logging or measurements devices within the wireline system described with reference to FIG. 2.

The galvanic tool 300 comprises an array laterolog positioned on a mandrel or tool body 302. Although an array laterolog is depicted, it is not intended to be limiting. The tool 300 comprises a central current electrode, or survey electrode, $A_0$, coupled to the tool body 302 and surrounded symmetrically by additional current electrodes $A_1$-$A_6$ and $A_1'$-$A_6'$, which may form current injection or return electrode pairs $A_1/A_1'$-$A_6/A_6'$. Voltage or monitor electrodes $M_1$-$M_{10}$ may be spaced between the current electrodes on one side of the survey electrode $A_0$, and each of the monitor electrodes $M_1$-$M_{10}$ may form a monitor electrode pair with an electrode (not shown) placed symmetrically on an opposite side of the survey electrode $A_0$. Each of the current and monitor electrodes also may be coupled to the tool body 302. As depicted, the tool 300 is characterized by internal coupling impedances between the each current electrode $A_0$-$A_6$, as well as internal coupling impedances between the monitor electrodes $M_1$-$M_{10}$ and a reference electrode, such as armor 304 surrounding the wireline cable coupled to the galvanic tool. For illustrative purposes, an internal impedance $Z_{1,6}$ between the current electrodes $A_1$ and $A_6$, and an internal impedance $Z_{2,6}$ between the current electrodes $A_2$ and $A_6$ have been depicted.

In use, the galvanic tool 300 may be introduced into a borehole and a current may be injected into the formation from the survey electrode $A_0$. The injected current may be received or returned at any one or more of the current electrode pairs selected to receive the injected current. A voltage induced in the formation by the injected current may be measured by one or more of the monitor electrodes $M_1$-$M_{10}$ In certain embodiments, the tool 300 may be characterized by excitation modes in which different ones of the current or voltage electrodes are energized. For instance, assuming electrode $A_6$ comprises the current return, the tool 300 may be characterized by excitation modes $f_0$-$f_5$ that respectively correspond to the excitation of current electrodes $A_0$-$A_5$ The tool may further be characterized by excitation modes $f_{m1}$-$f_{m10}$ corresponding to current injected from voltage electrodes $M_1$-$M_{10}$ and returning at the armor. Each excitation mode produces voltage measurements in response to the injected current.

An excitation mode $f_0$ in which electrode $A_0$ is excited and an example current $I_{0,f0}$ has been generated between the survey electrode $A_0$ and the return electrode $A_6$ In an ideal tool, infinite internal coupling impedances between the current electrodes and monitor electrodes may prevent current from being received the monitor electrodes $M_1$-$M_{10}$ of the tool 300, and at any of the current electrodes $A_1$-$A_6$ of the tool 300 not functioning as the current return when the current $I_{0,f0}$ is generated. The tool 300, however, comprises a realistic tool with finite internal coupling impedances. These finite internal coupling impedances allow for leakage currents to flow between the survey electrode $A_0$ and the other current and monitor electrodes of the tool 300. These leakage currents include, but are not limited to, leakage currents $I_{1,f0}$ and $I_{2,f0}$ to flow between the current electrode $A_0$ and the current electrodes $A_1$ and $A_2$ respectively, and leakage currents $I_{M1,f0}$ and $I_{M2,f0}$ to flow between the electrode $A_0$ and the monitor electrodes $M_1$ and $M_2$ respectively.

When deployed downhole within a formation, measurement generated at the tool 300 may then be stored at the tool 300 for later retrieval and processing, or transmitted to a remote information handling system, such as an information handling system communicably coupled to the tool 300 through a wireline (not show), for processing in real-time or near real time. The measurements may be processed to account for the leakage currents and determine resistivity characteristics of the formation, as will be described below. In certain embodiments, measurements may be generated, measured, stored, and/or transmitted by a control system associated with the tool 300.

Figure 4:
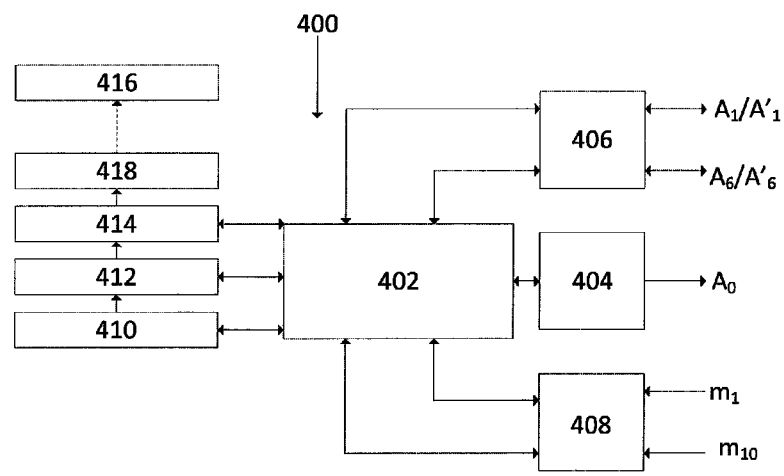
FIG. 4 is a diagram of an example control system for a galvanic tool, according to aspects of the present disclosure.

FIG. 4 is a diagram of an example control system 400 for galvanic tool similar to the tool described above with reference to FIG. 3. As depicted, the system 400 comprises a control unit 402 that may function as the primary controller for the tool and may be communicably coupled to a survey electrode $A_0$ through associated electronics 404; communicably coupled to current return electrode pairs $A_1/A_1'$-$A_6/A_6'$ through associated electronics 406; and communicably coupled to voltage or monitor electrodes $M_1$-$M_{10}$ through associated electronics 408. As used herein, a controller may include an information handling system or any other device that contains at least one processor configured to perform certain actions. Example processors include, but are not limited to, microprocessors, microcontrollers, digital signal processors (DSP), application specific integrated circuits (ASIC), or any other digital or analog circuitry configured to interpret and/or execute program instructions and/or process data.

The control unit 402 may function through the associated electronics 404 to cause the survey electrode $A_0$ to inject a current into a formation. The control unit 402 may also receive through the associated electronics 408 measurements from the voltage or monitor electrodes $M_1$-$M_{10}$ that correspond to the voltage developed in the formation by the injected current. In certain embodiments, the control unit 402 may also function through the associated electronics 406 to select which of the current injection or return electrode pairs $A_1/A_1'$-$A_6/A_6'$ function as the current return for the injected current, and may also function to select which of the voltage or monitor electrodes $M_1$-$M_{10}$ obtain voltage measurements from the formation at a given time. The control unit 402 may make the above selections of the current injection or return electrode pairs $A_1/A_1'$-$A_6/A_6'$ and voltage or monitor electrodes $M_1$-$M_{10}$ through the use of one of more switches within the relevant associated electronics 406/408, for instance, that the control unit 402 may control and through which the current injection or return electrode pairs $A_1/A_1'$-$A_6/A_6'$ and voltage or monitor electrodes $M_1$-$M_{10}$ may be selectively connected to the control unit 402.

In addition to receiving measurements from the voltage or monitor electrodes $M_1$-$M_{10}$ corresponding to the induced voltage within the formation, the control unit 402 may also receive measurements corresponding to the currents generated by and received at the current and monitor electrodes. For instance, the control unit 402 may receive measurements corresponding to the strength of the current generated by the survey electrode A0, and the strength of the leakage currents received through the voltage and current electrodes, and the voltage measurements from the voltage electrodes. The control unit 402 may transmit the received current and voltage measurements to a data acquisition unit 410 coupled to the control unit 402. Upon reception at the data acquisition unit 410, the measurements may be digitized, stored in a data buffer 412, preprocessed at data processing unit 414, and sent to the surface 416 through a communication unit 418, which may comprise a downhole telemetry system. Alternatively, the raw or processed measurements may be stored in the control system 400. Modifications, additions, or omissions may be made to FIG. 4 without departing from the scope of the present disclosure. For instance, the orientation and configuration of the control system may by altered, depending on the application.

Certain voltage and current measurements generated at the galvanic tool may be used to determine resistivity characteristics of the formation in which the measurements were taken. Typically, galvanic tools are modeled using a standard set of linear equations that relate the measured voltages at the monitor electrodes with the transmitted/received currents of the current electrodes. One example standard set of linear equations may include the following equation for mode $f_1$ of a galvanic tool:

$$R_{a,f1} = k_1 \frac{UM_1}{I_0}$$

where $UM_1 = UM_{1,f1} + C_{1,1} UM_{1,f0} + C_{1,2} UM_{1,f2}$, and $I_0 = C_{1,1} I_{0,f_j}$, and $k_1$ is the tool constant of focused mode 1. The weighting constants $C_{1,1}$ and $C_{1,2}$ are the solution of the following matrix equation For example the focused apparent resistivity of mode 1 is given by $$\begin{bmatrix} \Delta VM_{1,2,f0} & \Delta VM_{1,2,f2} \\ I_{1,f0} & I_{2,f2} \end{bmatrix} \begin{bmatrix} C_{1,1} \\ C_{1,2} \end{bmatrix} = \begin{bmatrix} -\Delta VM_{1,2,f1} \\ -I_{0,f1} \end{bmatrix}$$

$\Delta VM_{1,2,fj}$ is the potential difference between monitoring electrodes 1 and 2 when the tool is excited with frequency $f_j$. $I_{i,fj}$ is the current injected from electrode $A_i$ when the tool is excited with frequency $f_j$.

This model then is used to calculate the resistivity of the formation based on the measured voltages from the voltage electrodes and measured currents at the current electrodes. The standard set of linear equations, however, assumes there are infinite internal coupling impedances between the current electrodes of the tool and, therefore, that all current transmitted from the survey electrode $A_0$ flows through the formation into the selected current return electrode pair. In practice, as described above, there are finite internal coupling impedances between the current electrodes and between voltage electrodes and the reference electrode such that some of the transmitted current from the survey electrode $A_0$ will flow to the selected current return electrode pair through the non-selected current electrodes and voltage electrodes as leakage current. The presence of leakage current reduces the amount of injected current within the formation, causing the physical implementation of the tool to depart from the linear relationships used in the typical galvanic tool model. Additionally, the amount of leakage current can be varied by a sometimes indeterminate amount due to the downhole temperature and pressure effects on the internal coupling impedances of the downhole tool, further reducing the accuracy of the determined formation resistivity.

Figure 5:
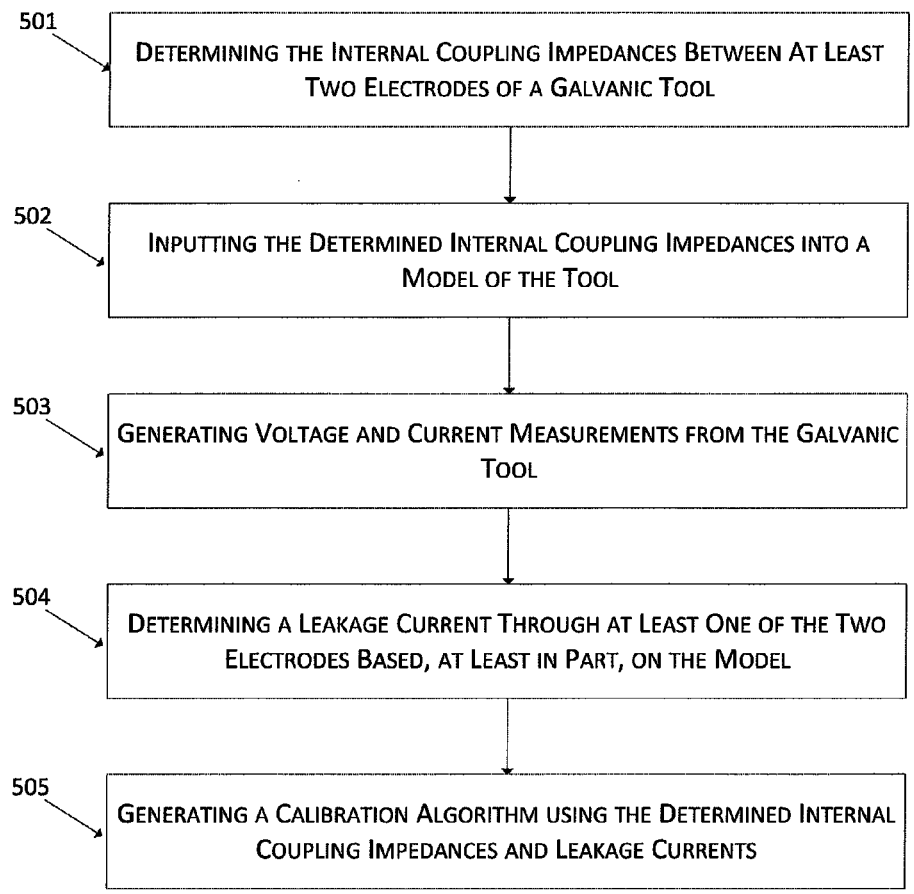
FIG. 5 is a flow diagram of an example calibration method, according to aspects of the present disclosure.

According to aspects of the present disclosure, a calibration process may be used to determine internal impedance values and leakage currents, which can, in turn, be used to calibrate and reduce the effects of the leakage current on voltage measurements taken at a downhole galvanic tool. Resistivity calculations may be performed based, at least in part, on the calibrated voltage measurements, which may produce a more accurate resistivity value. FIG. 5 is a flow diagram of an example calibration process, according to aspects of the present disclosure. Step 501 of the method comprises determining the internal coupling impedances between at least two electrodes of the galvanic tool. In certain embodiments, determining the internal coupling impedances may comprise determining the internal coupling impedances between all of the electrodes of the galvanic tool. In other embodiments, determining the internal coupling impedances may comprise determining the internal coupling impedances between the current electrodes of the galvanic tool. The internal coupling impedances may be physically measured at the galvanic tool or calculated with knowledge of the components used within the tool. Step 501 may be performed, for instance, when a galvanic tool is being manufactured or assembled, during a calibration step performed remote from logging operations, or during a calibration step performed at the site of the logging operation. These determined internal coupling impedances may be stored or otherwise associated with the tool.

Step 502 comprises inputting the determined internal coupling impedances into a model of the tool. The model of the tool may comprise a mathematical model that is generated at an information handling systems used as part of the calibration process. The model may comprise a modified set of linear equations that account for the internal coupling impedances in the voltage and current relationship between the electrodes. One example modified set of linear equation may comprise the following equation for mode $f_1$ of a galvanic tool:

$$\begin{bmatrix} \Delta V_{1,2,f_0} & \Delta V_{1,2,f_2} & \Delta V_{1,2,f_3} & \Delta V_{1,2,f_4} & \Delta V_{1,2,f_5} \\ \sum_{i=0}^{2} I_{i,f_0} & \sum_{i=0}^{2} I_{i,f_2} & \sum_{i=0}^{2} I_{i,f_3} & \sum_{i=0}^{2} I_{i,f_4} & \sum_{i=0}^{2} I_{i,f_5} \\ I_{3,f_0} & I_{3,f_2} & I_{3,f_3} & I_{3,f_4} & I_{3,f_5} \\ I_{4,f_0} & I_{4,f_2} & I_{4,f_3} & I_{4,f_4} & I_{4,f_5} \\ I_{5,f_0} & I_{5,f_2} & I_{5,f_3} & I_{5,f_4} & I_{5,f_5} \end{bmatrix} \begin{bmatrix} C_0 \\ C_2 \\ C_3 \\ C_4 \\ C_5 \end{bmatrix} = \begin{bmatrix} -\Delta V_{1,2,f_1} \\ -\sum_{i=0}^{2} I_{i,f_1} \\ -I_{3,f_1} \\ -I_{4,f_1} \\ -I_{5,f_1} \end{bmatrix}$$

$$V_1 = C_0 V_{1,f_0} + V_{1,f_1} + C_2 V_{1,f_2} + C_3 V_{1,f_3} + C_4 V_{1,f_4} + C_5 V_{1,f_5}$$

$$I_0 = C_0 I_{0,f_0} + I_{0,f_1} + C_2 I_{0,f_2} + C_3 I_{0,f_3} + C_4 I_{0,f_4} + C_5 I_{0,f_5}$$

$$R_{a_1} = k_1 \frac{V_1}{I_0}$$

where $\Delta V_{1,2,f_j}$ comprise the voltage differential between monitor electrodes 1 and 2 at frequency $f_j$; $V_{1,f_j}$ comprises the voltage measured at monitor electrode 1 at frequency $f_i$; and $I_{i,f_k}$ comprises the current received at electrode i at frequency $f_j$. These equations comprise a modified version of the standard set of equations described earlier, and may account for internal coupling impedances and leakage currents. In certain embodiments, inputting the determined internal coupling impedances into a model of the tool may comprise storing the determined internal coupling impedances in a storage device of an information handling system that can be accessed by a processor of the information handling system. In certain embodiments, the modified set of linear equations may be implemented, for instance, as software or a processing algorithm on the information handling system that the processor executes to calculate formation resistivity values for received voltage measurements. The processor may retrieve the stored internal coupling impedances when executing the software or processing algorithm.

Step 503 comprises generating voltage and current measurements from the galvanic tool using at least one calibration box. Calibration boxes may emulate the responses of formations with differing resistivity values. Generating voltage and current measurements from the galvanic tool using at least one calibration box may comprise physically placing a galvanic tool in contact with the calibration box, injecting current from at least one current electrode of the galvanic tool, and measuring the voltages and currents generated by the injected current with at least one voltage electrode of the galvanic tool. In certain instances, current may be injected from at least one current electrode of the galvanic tool and voltages and currents generated by the injected current may be measured through the manipulation of the control system for the galvanic tool, which may take the form of the control system described above with respect to FIG. 4. The generated voltage and current measurements may also be stored at the information handling system.

Step 504 may comprise determining a leakage current through at least one of the two electrodes based, at least in part, on the model and the voltage and current measurements. This may include inputting the measured voltage and currents into the equation expressed above with respect to step 502. For instance, once the voltage and current measurements are generated using the calibration box, the measurements may then be processed using the model of the galvanic tool containing the determined internal coupling impedances to determine the leakage currents within each of the current electrodes during testing within calibration box. Alternatively, or in addition, the leakage current through at least one of the two electrodes may be determined through direct measurements at the electrode while measurements are being taken within the calibration box.

Step 505 comprises generating a calibration algorithm using the determined internal coupling impedances and leakage currents. For instance, once the internal coupling impedances and leakage currents are determined, the internal coupling impedances and leakage currents may be associated with the injected current, voltage measurements and resistivity values used or captured at the calibration box to identify how the leakage currents affect voltage measurements captured at the tool, e.g., the manner in which the leakage currents cause non-ideal voltage measurements to be taken at the galvanic tool. An example calibration algorithm may receive as inputs the measured voltages, currents, and downhole leakage currents from the galvanic tool when it is deployed downhole, and may output calibrated voltage measurements that reduce the effects of any associated leakage currents on the voltage measurements and more accurately represent "ideal" measurements. In certain embodiments, once determined, the calibration algorithm may be implemented as a software construct on an on-site information handling system (e.g., control unit 32 in FIG. 1) that may receive measurements from a galvanic tool positioned in a borehole, determine calibrated voltage measurements using the calibration algorithm, and then calculate resistivity characteristics for the formation using the calibrated voltage measurements.

In certain embodiments, the model of the tool may further account for the temperature and pressure conditions of the galvanic tool when the tool is positioned within a borehole. In certain embodiments, the model may receive as an input the downhole temperature and pressure conditions from the galvanic tool and may select coefficients to modify the determined internal coupling impedances based, at least in part, on the downhole temperature and pressure conditions. The modified determined internal coupling impedances may then be imported into the model to calculate the resistivity of the formation. In certain embodiments, the temperature may be characterized at discrete points which can then be used to interpolate/extrapolate the coefficients at different temperatures. Additionally, the model of the tool with the internal coupling impedances may be used with various software focusing techniques to improve the accuracy of the resulting resistivity determinations.

Figure 6:
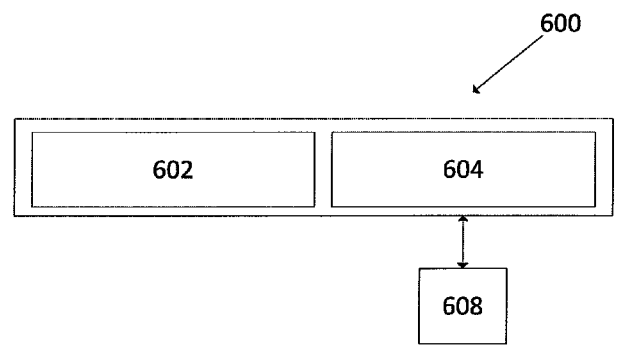
FIG. 6 is a diagram of an example information handling system, according to aspects of the present disclosure.

As described above, an information handling system may receive measurements from a galvanic tool, calibrate the measurements, and use the calibrated measurements to determine resistivity characteristics of a formation. FIG. 6 illustrates a block diagram of an example information handling system 600, in accordance with embodiments of the present disclosure. Information handling system 600 or components thereof can be located at the surface, downhole, or some combination of both locations (e.g., certain components may be disposed at the surface while certain other components may be disposed downhole, with the surface components being communicatively coupled to the downhole components).

As depicted, information handling system 600 includes a processor 602. The processor 602 may include, for example a microprocessor, microcontroller, digital signal processor (DSP), application specific integrated circuit (ASIC), or any other digital or analog circuitry configured to interpret and/or execute program instructions and/or process data. In some embodiments, processor 602 may be communicatively coupled to memory 604. Processor 602 may be configured to interpret and/or execute program instructions or other data retrieved and stored in memory 604. Program instructions or other data may constitute portions of software 606 for carrying out one or more methods described herein. Memory 604 may include any system, device, or apparatus configured to hold and/or house one or more memory modules; for example, memory 604 may include read-only memory (ROM), random access memory (RAM), solid state memory, or disk-based memory. Each memory module may include any system, device or apparatus configured to retain program instructions and/or data for a period of time (e.g., computer-readable non-transitory media). For example, instructions from software 606 may be retrieved and stored in memory 604 for execution by processor 602.

Modifications, additions, or omissions may be made to FIG. 6 without departing from the scope of the present disclosure. For example, FIG. 6 shows a particular configuration of components of information handling system 600. However, any suitable configurations of components may be used. For example, components of information handling system 600 may be implemented either as physical or logical components. Furthermore, in some embodiments, functionality associated with components of information handling system 600 may be implemented in special purpose circuits or components. In other embodiments, functionality associated with components of information handling system 600 may be implemented in configurable general purpose circuit or components. For example, components of information handling system 600 may be implemented by configured computer program instructions.

In certain embodiments, an information handling system or processor may receive at least one of current, voltage, and resistivity measurements from a galvanic tool positioned within a borehole. The information handling system may be located downhole, such as within the galvanic tool, or at the surface. The measurements may be generated using the current injection and voltage monitoring functionality described above. The information handling system may further receive a leakage current value for the galvanic tool determined using at least one internal coupling impedance between at least two electrodes of the galvanic tool. The leakage current value may have been determined during a calibration process and subsequently stored in the information handling system for retrieval when resistivity values for a formation are to be determined. At least one of the received current, voltage, and resistivity measurements may then be calibrated based, at least in part, on the received leakage current value. Calibrating the measurements may adjust for the leakage currents within the galvanic tool and improve the formation resistivity values calculated using the measurements.

In certain embodiments, an information handling system or a processor may receive at least one of current, voltage, and resistivity measurements from a galvanic tool positioned within a borehole. The information handling system may be positioned downhole, such as in the galvanic tool, or at the surface. A stored leakage current value for the galvanic tool determined using at least one internal coupling impedance between at least two electrodes of the galvanic tool and be received at the information handling system or processor. At least one of the received current, voltage, and resistivity measurements may then be calibrated based, at least in part, on the stored leakage current value. In certain embodiments, the information handling system or processor may also receive a downhole leakage current value from the galvanic tool positioned within the borehole and calibrate at least one of the received current, voltage, and resistivity measurements based, at least in part, on the stored leakage current value and the downhole leakage current value.

According to aspects of the present disclosure, an example calibration method for a galvanic tool may include determining an internal coupling impedance between at least two electrodes of the galvanic tool, and inputting the determined internal coupling impedances into an equation used to evaluate the response of the tool. Voltage and current measurements may be generated from the galvanic tool using a calibration device. A leakage current value through at least one of the two electrodes may be determined based, at least in part, on the voltage and current measurements and the equation. The leakage current may be stored.

In one or more embodiments described in the preceding paragraph, the method may further include receiving one or more voltage measurements from the galvanic tool captured while the galvanic tool is positioned in a borehole within a formation; and calibrating the received voltage measurements using the stored leakage current value.

In one or more embodiments described in the preceding paragraph, the method further comprises determining at least one resistivity value for the formation using the calibrated voltage measurements.

In one or more embodiments described in the preceding three paragraphs, generating voltage and current measurements from the galvanic tool using the calibration device comprises positioning the galvanic tool within a calibration box; injecting at least one current into the calibration box using at least one current electrode of the galvanic tool; and measuring a voltage response of the calibration box to the injected current using at least one voltage electrode of the galvanic tool.

In one or more embodiments described in the preceding four paragraphs, the equation comprises a linear equation modeling the response of the galvanic tool.

In one or more embodiments described in the preceding five paragraphs, the method further includes generating a calibration algorithm based, at least in part, on the stored leakage current value.

In one or more embodiments described in the preceding six paragraphs, determining the leakage current value comprises measuring the leakage current value.

In one or more embodiments described in the preceding seven paragraphs, the method further includes positioning the galvanic tool within a borehole in a formation; receiving at least one voltage measurement corresponding to the formation from the galvanic tool; receiving the stored leakage current value for the galvanic tool; and calibrating the at least one voltage measurement using stored leakage current value.

According to aspects of the present disclosure, an example method may include positioning a galvanic tool within a borehole in a formation, and receiving at least one of current and voltage measurements from the galvanic tool. The method may further include receiving a stored leakage current value for the galvanic tool determined using at least one internal coupling impedance between at least two electrodes of the galvanic tool. At least one of the received current and voltage measurements may be calibrated based, at least in part, on the stored leakage current value.

In one or more embodiments described in the preceding paragraph, the method may further include receiving a downhole leakage current value from the galvanic tool positioned within the borehole; and calibrating at least one of the received current and voltage measurements based, at least in part, on the stored leakage current value and the downhole leakage current value.

In one or more embodiments described in the preceding two paragraphs, the method may further include determining at least one resistivity value for the formation using the calibrated voltage measurements.

In one or more embodiments described in the preceding three paragraphs, the method may further include determining the at least one internal coupling impedance an internal coupling impedance between at least two electrodes of the galvanic tool, and inputting the at least one internal coupling impedance into an equation used to evaluate the response of the tool. Voltage and current measurements from the galvanic tool may be generated using a calibration device. The stored leakage current value may be determined based, at least in part, on the voltage and current measurements and the equation.

In one or more embodiments described in the preceding paragraph, generating voltage and current measurements from the galvanic tool using the calibration device comprises positioning the galvanic tool within a calibration box; injecting at least one current into the calibration box using at least one current electrode of the galvanic tool; and measuring a voltage response of the calibration box to the injected current using at least one voltage electrode of the galvanic tool.

In one or more embodiments described in the preceding two paragraphs, wherein the equation comprises a linear equation modeling the response of the galvanic tool.

In one or more embodiments described in the preceding three paragraphs the method further includes generating a calibration algorithm based, at least in part, on the stored leakage current value.

According to aspects of the present disclosure, an example system includes a galvanic tool with at least two electrodes, and an information handling system communicably coupled to the galvanic tool. The information handling system may comprise a processor and memory device coupled to the processor. The memory device may contain a set of instructions that, when executed by the processor, cause the processor to receive at least one of current and voltage measurements from the galvanic tool; receive a leakage current value for the galvanic tool determined using at least one internal coupling impedance between at least two electrodes of the galvanic tool; and calibrate at least one of the received current and voltage measurements based, at least in part, on the received leakage current value.

In one or more embodiments described in the preceding paragraph, the set of instructions further cause the processor to receive a downhole leakage current value from the galvanic tool positioned within the borehole; and calibrate at least one of the received current and voltage measurements based, at least in part, on the stored leakage current value and the downhole leakage current value.

In one or more embodiments described in the preceding two paragraphs, the set of instructions further cause the processor to determine at least one resistivity value for the formation using the calibrated voltage measurements.

In one or more embodiments described in the preceding three paragraphs, the set of instructions that cause the processor to calibrate at least one of the received current and voltage measurements based, at least in part, on the received leakage current value further cause the processor to calibrate at least one of the received current and voltage measurements using a calibration algorithm determined using the received leakage current value.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the element that it introduces.

What is claimed is:

1. A calibration method for a galvanic tool, comprising:
   determining an internal coupling impedance between at least two electrodes of the galvanic tool;
   inputting the determined internal coupling impedances into an equation used to evaluate the response of the galvanic tool;
   generating voltage and current measurements from the galvanic tool using a calibration device;
   determining a leakage current value through at least one of the two electrodes based, at least in part, on the voltage and current measurements and the equation;
   receiving one or more voltage measurements from the galvanic tool;
   storing the leakage current value; and
   calibrating the received one or more voltage measurements using the stored leakage current value, wherein calibrating the received voltage measurements comprises adjusting the received one or more voltage measurements based on the stored leakage current value.

2. The method of claim 1 wherein:
   the one or more voltage measurements are received from the galvanic tool captured while the galvanic tool is positioned in a borehole within a formation.

3. The method of claim 1 further comprising:
   determining at least one resistivity value for the formation using the calibrated voltage measurements.

4. The method of claim 1, wherein generating voltage and current measurements from the galvanic tool using the calibration device comprises
   positioning the galvanic tool within a calibration box;
   injecting at least one current into the calibration box using at least one current electrode of the galvanic tool; and
   measuring a voltage response of the calibration box to the injected current using at least one voltage electrode of the galvanic tool.

5. The method of claim 1, wherein the equation comprises a linear equation modeling the response of the galvanic tool.

6. The method of claim 1, further comprising generating a calibration algorithm based, at least in part, on the stored leakage current value.

7. The method of claim 1, wherein determining the leakage current value comprises measuring the leakage current value.

8. The method of claim 1, further comprising
   positioning the galvanic tool within a borehole in a formation;
   receiving at least one voltage measurement corresponding to the formation from the galvanic tool;
   receiving the stored leakage current value for the galvanic tool; and
   calibrating the at least one voltage measurement using stored leakage current value.

9. A method, comprising:
positioning a galvanic tool within a borehole in a formation;
receiving at least one of current and voltage measurements from the galvanic tool;
receiving a stored leakage current value for the galvanic tool determined using at least one internal coupling impedance between at least two electrodes of the galvanic tool;
calibrating at least one of the received current and voltage measurements based, at least in part, on the stored leakage current value, wherein calibrating the at least one of the received current and voltage measurements comprises adjusting the received at least one of the received current and voltage measurements based on the stored leakage current value.

10. The method of claim 9, further comprising
receiving a downhole leakage current value from the galvanic tool positioned within the borehole; and
calibrating at least one of the received current and voltage measurements based, at least in part, on the stored leakage current value and the downhole leakage current value.

11. The method of claim 9, further comprising determining at least one resistivity value for the formation using the calibrated voltage measurements.

12. The method of claim 9, further comprising
determining the at least one internal coupling impedance an internal coupling impedance between at least two electrodes of the galvanic tool;
inputting the at least one internal coupling impedance into an equation used to evaluate the response of the tool;
generating voltage and current measurements from the galvanic tool using a calibration device; and
determining the stored leakage current value based, at least in part, on the voltage and current measurements and the equation.

13. The method of claim 11, wherein generating voltage and current measurements from the galvanic tool using the calibration device comprises
positioning the galvanic tool within a calibration box;
injecting at least one current into the calibration box using at least one current electrode of the galvanic tool; and
measuring a voltage response of the calibration box to the injected current using at least one voltage electrode of the galvanic tool.

14. The method of claim 11, wherein the equation comprises a linear equation modeling the response of the galvanic tool.

15. The method of claim 11, further comprising generating a calibration algorithm based, at least in part, on the stored leakage current value, wherein the at least one of the received current and voltage measurements is calibrated based on the calibration algorithm.

16. A system, comprising:
a galvanic tool with at least two electrodes; and
an information handling system communicably coupled to the galvanic tool, the information handling system comprises a processor and memory device coupled to the processor, the memory device containing a set of instruction that, when executed by the processor, cause the processor to:
receive at least one of current and voltage measurements from the galvanic tool;
receive a leakage current value for the galvanic tool determined using at least one internal coupling impedance between at least two electrodes of the galvanic tool;
calibrate the received voltage measurement based, at least in part, on the received leakage current value, wherein calibrating the received at least one of the current and voltage measurement comprises adjusting the received at least one of the current and voltage measurement based on the leakage current.

17. The system of claim 16, wherein the set of instructions further cause the processor to
receive a downhole leakage current value from the galvanic tool positioned within the borehole; and
calibrate at least one of the received current and voltage measurements based, at least in part, on the stored leakage current value and the downhole leakage current value.

18. The system of claim 16, wherein the set of instructions further cause the processor to determine at least one resistivity value for the formation using the calibrated voltage measurements.

19. The system of claim 16, wherein the set of instructions that cause the processor to calibrate at least one of the received current and voltage measurements based, at least in part, on the received leakage current value further cause the processor to calibrate at least one of the received current and voltage measurements using a calibration algorithm determined using the received leakage current value.

* * * * *